(12) United States Patent
Matsuzaki et al.

(10) Patent No.: US 8,054,680 B2
(45) Date of Patent: Nov. 8, 2011

(54) SEMICONDUCTOR DEVICE

(75) Inventors: Nozomu Matsuzaki, Kokubunji (JP);
Tetsuya Ishimaru, Kokubunji (JP);
Makoto Mizuno, Setagaya (JP);
Takashi Hashimoto, Iruma (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 10/852,150

(22) Filed: May 25, 2004

(65) Prior Publication Data

US 2005/0006698 A1 Jan. 13, 2005

(30) Foreign Application Priority Data

May 28, 2003 (JP) .................. 2003-150226
Apr. 26, 2004 (JP) .................. 2004-129233

(51) Int. Cl.
*G11C 11/34* (2006.01)
*G11C 7/00* (2006.01)
*H01L 29/792* (2006.01)

(52) U.S. Cl. ........ 365/184; 365/186; 365/218; 257/324; 257/326; 257/E29.309

(58) Field of Classification Search .................. None
See application file for complete search history.

(56) References Cited

U.S. PATENT DOCUMENTS

| | | | | |
|---|---|---|---|---|
| 3,882,469 A * | 5/1975 | Gosney, Jr. | .................. | 365/184 |
| 5,408,115 A * | 4/1995 | Chang | .................. | 257/324 |
| 5,798,548 A | 8/1998 | Fujiwara | | |
| 6,445,617 B1 * | 9/2002 | Sakakibara | .................. | 365/185.22 |
| 6,711,060 B2 | 3/2004 | Sakakibara | | |
| 6,807,101 B2 * | 10/2004 | Ooishi et al. | .................. | 365/185.21 |
| 6,856,552 B2 * | 2/2005 | Takahashi | .................. | 365/185.29 |
| 6,894,931 B2 * | 5/2005 | Yaegashi et al. | .................. | 365/185.22 |
| 7,057,230 B2 | 6/2006 | Tanaka et al. | | |
| 7,414,283 B2 | 8/2008 | Tanaka et al. | | |
| 7,700,992 B2 | 4/2010 | Tanaka et al. | | |
| 2003/0071302 A1 * | 4/2003 | Hirotomo et al. | .................. | 257/314 |
| 2003/0210573 A1 * | 11/2003 | Lee | .................. | 365/185.29 |
| 2004/0188753 A1 * | 9/2004 | Kawashima et al. | .................. | 257/316 |
| 2010/0157689 A1 | 6/2010 | Tanaka et al. | | |

FOREIGN PATENT DOCUMENTS

JP 09-036264 * 2/1997

(Continued)

OTHER PUBLICATIONS

Ito et al. A Novel MNOS Technology Using Gate Hole Injection in Erase Operation for Embedded Nonvolatile Memory Applications. Jun. 15-17, 2004. IEEE. Symposium on VLSI Technology Digest of Technical Papers. pp. 80-81.*

(Continued)

*Primary Examiner* — Hoang-Quan Ho
(74) *Attorney, Agent, or Firm* — Miles & Stockbridge P.C.

(57) ABSTRACT

Memory cells in which an erase and write operation is performed by injecting electrons from a substrate and extracting the electrons into a gate electrode constitute a semiconductor nonvolatile memory device. That is a gate extraction semiconductor nonvolatile memory device. In that device, if an erase bias is applied in a first process of an erase and write operation, memory cells in an overerase condition occur and the charge retention characteristics of such memory cells are degraded. The present invention provides a semiconductor nonvolatile memory device using means for writing all the memory cells in an erase unit before applying the erase bias, and then applying the erase bias.

18 Claims, 6 Drawing Sheets

FOREIGN PATENT DOCUMENTS

| | | | |
|---|---|---|---|
| JP | 09-036264 A | | 2/1997 |
| JP | 2000-021181 | * | 1/2000 |
| JP | 2000-021181 A | | 1/2000 |
| WO | WO 03/012878 A1 | | 2/2003 |

OTHER PUBLICATIONS

Kimura et al. Fowler-Nordheim current injection and write/erase characteristics of metal-oxide-nitride-oxide-Si structure grown with helicon-wave excited plasma processing. Jan. 1, 1999. Journal of Applied Physics. vol. 85, No. 1.*

Yanagi et al. Quantum confinement effect for efficient hole injection in MONOS-type nonvolatile memory-the role of ultrathin i-Si/P+ poly-Si stacked gate structure fabricated by laser spike annealing. 2007. IEEE. . Symposium on VLSI Technology Digest of Technical Papers. pp. 146-147.*

* cited by examiner

FIG. 1a
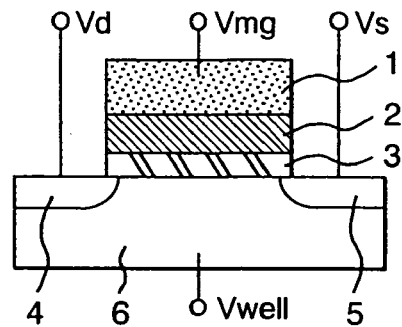
FIG. 1b
|  | Vmg | Vs | Vd | Vwell |
|---|---|---|---|---|
| WRITE | 8V | 5V | 0V | 0V |
| ERASE | 12V | 0V | 0V | 0V |
| READ | 1V | 1V | 0V | 0V |
FIG. 2
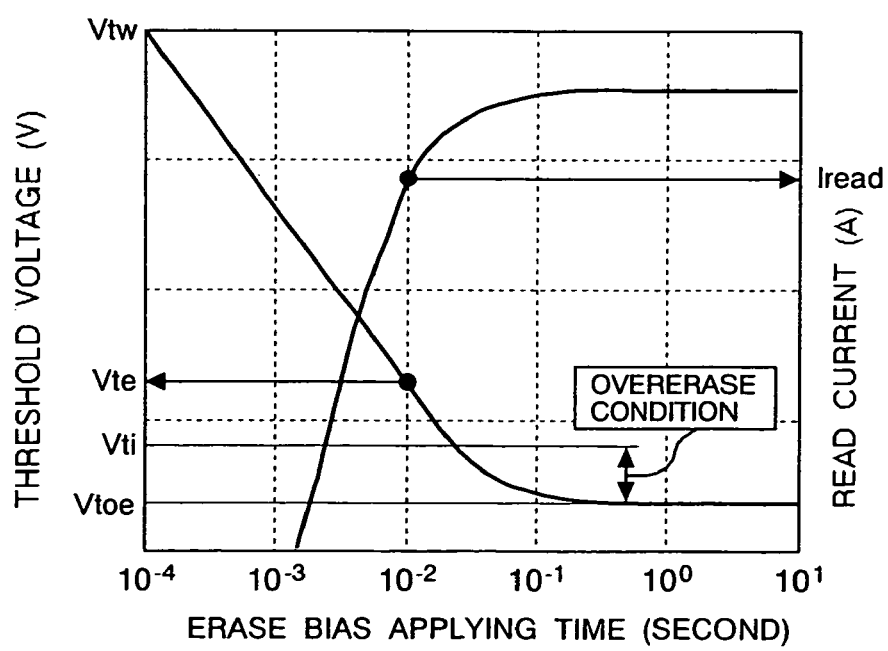

SEMICONDUCTOR DEVICE

CLAIM OF PRIORITY

The present application claims priority from Japanese application JP2004-129233, filed on Apr. 26, 2004, which further claims priority from Japanese patent application JP 2003-150226, filed on May 28, 2003, the contents of which are hereby incorporated by reference into this application.

BACKGROUND OF THE INVENTION

1. Field of the Invention

The present invention relates to a semiconductor device, in particular, to a structure of a semiconductor nonvolatile memory device and improvement of reliability thereof. The semiconductor nonvolatile memory device is mounted on the same substrate as a semiconductor device having a logic operation function, which is typified by a microcomputer.

2. Description of the Related Art

Semiconductor nonvolatile memory devices of a floating gate type are widely used. In recent years, MONOS or MNOS memory devices that store electric charge in charge trapping films are reassessed in terms of applications such as large capacity data storage and implementation on the same silicon substrate as logic semiconductor devices. Hereinafter, a single semiconductor nonvolatile memory device is referred to as a memory cell. A whole device that is comprised of a plurality of the memory cells and has a nonvolatile memory function is referred to as a semiconductor nonvolatile memory device. In relation to the present invention, for example, U.S. Pat. No. 5,408,115 showing operations for injecting and extracting electrons into/from memory cells is known. This document discloses a technique for injecting electrons into a three-layer charge storage structure consisting of an oxide film, a nitride film, and an oxide film by source-side hot-electron injection. The document also discloses a technique for extracting the electrons into a gate electrode by applying a positive voltage to the gate electrode.

SUMMARY OF THE INVENTION

The inventors of the present invention have considered operations of a memory cell, in which a write operation is performed by using hot-electron injection and an erase operation is performed by extracting the injected charge into a gate electrode. FIG. 1a shows a structure of the memory cell, and FIG. 1b shows a relationship between various operational modes and voltage values. Here, Vmg is a voltage applied to an N-type gate electrode, Vd is a voltage applied to an N-type drain electrode, Vs is a voltage applied to an N-type source electrode, and Vwell is a voltage applied to a P-type well. Here, the electron injection is defined as write and the electron extraction is defined as erase.

FIG. 2 shows erase characteristics of the memory cell. In the write state in which the electrons are injected, the threshold takes a value Vtw, wherein no current flows even if the read operation is performed. As an erase bias is applied, the threshold is reduced and the read current is increased. When the read current reaches Iread, the erase operation is determined. At this time, the erase threshold takes a value Vte. Further, as the erase bias is applied continuously, the threshold is reduced below the charge neutral threshold Vti. The threshold is saturated at Vtoe and a state in which the threshold resides between Vti and Vtoe is defined as an overerase condition.

As a result of comparison between the initial state and the state after the erase and write operation of the charge retention characteristics of the memory cell having the erase characteristics as described above, the inventors have found that the charge extraction operation is a factor to significantly degrade the charge retention characteristics (see FIG. 3).

As shown in FIG. 3, the charge retention characteristics after the erase and write operation is performed 1000 times differ little from the initial characteristics (without erase and write operation). However, when the voltage pulses corresponding to the accumulated erase time of the 1000 erase and write operations are applied to an identical memory cell, it can be seen that the charge retention characteristics are degraded significantly. As described below, it results not from the variation of the threshold after the write but from the degradation of the charge retention characteristics of the memory cell itself.

FIG. 4 shows the variations of the threshold when the erase and write operations are repeated alternately and when only the erase operations are performed. When the erase and write operations are repeated, the threshold is never reduced below Vte. It is because each erase operation is stopped when the threshold reaches Vte. On the other hand, when only the erase operations are performed, the erase bias is applied one-sidedly regardless of the value of the threshold or the read current. Therefore, the threshold of the memory cell that is subject to only the erase operations is reduced below Vte, which results in the overerase condition. Thus, it is considered that the charge retention characteristics are degraded because the erase operations are performed till the memory cell falls into the overerase condition.

Next, a phenomenon in which the degradation of the charge retention characteristics are degraded due to the overerase condition will be described with reference to a band diagram of FIG. 5. This N-type memory cell has a P-type well. This figure shows a state in which a positive charge is applied to the N-type gate electrode in order to extract the stored electrons into the gate electrode. The stored electrons move to the gate electrode along the electric field. The electrons are also injected from the underlying oxide layer by FN tunneling due to the high electric field. Meanwhile, the threshold is reduced continuously if the stored electrons move to the gate electrode more than the injected electrons. On the other hand, holes are generated at the interface between the gate electrode and the trapping film and tunneled into the trapping film. Then, the holes move into the substrate along the electric field. The stored electrons and the holes are recombined to disappear. If the electrons stored initially are lost and the number of the electrons tunneled from the underlying oxide film becomes equal to the number of the holes injected from the electrode, the threshold of the memory cell is saturated. As a result, the threshold is not reduced further. However, if the electric field is still applied, the holes are supplied continuously. Therefore, the holes that cannot be recombined with the electrons are tunneled through the underlying oxide film into the substrate. At this time, as energy is released, an energy level difference is created in the underlying oxide film or at the interface between the underlying oxide film and the substrate. It is thought that the stored charge leaks to the substrate through this energy level difference. As a result, the charge retention characteristics are degraded. In the erase and write operation in which the write operation is performed in the erase state, almost all the holes disappear by the recombination with the stored charge. The holes are not tunneled into the substrate, and the underlying oxide film is not damaged. However, when only the erase operation is performed, the holes are supplied in the overerase condition in which very few electrons are stored. The number of holes tunneled to the underlying oxide film is increased. As a result, when only the erase operations are performed, the charge retention characteristics are degraded significantly.

Next, this effect will be described in the example of an actual semiconductor nonvolatile memory device. FIG. 6 shows an exemplary configuration of a NOR-type semiconductor nonvolatile memory device. It is to be noted that only 12 memory cells are shown, because this figure is simplified for clearly demonstrating the problem and the principle of the present invention. Gate electrodes of three memory cells M11, M21, and M31 are connected to a word line WL1. Similarly, M12, M22, and M32 are connected to WL2, M13, M23, and M33 are connected to WL3, and M14, M24, and M34 are connected to WL4, respectively. Word drivers WD1 to WD4 supply voltages to WL1 to WL4, respectively. A decoder WDEC selects word drivers WL1 to WL4 and the word drivers WL1 to WL4 are driver circuits for supplying voltages to WL1-WL4. Drains of M11, M12, M13, and M14 are connected to a bit line BL1. Similarly, drains of M21, M22, M23, and M24 are connected to BL2, and drains of the memory cells M31, M32, M33, and M34 are connected to BL3. BDEC is comprised of a decoder and a sense amplifier and selects BL1 to BL3. Sources of all the memory cells M11 to M34 are commonly connected to a source line SL1. SL1 is selected by SDEC. It is assumed that all the memory cells in the figure are subject to erase and write operation and in an erase block (an identical erase unit). In the erase and write operation, 12 V is applied to WL1 to WL4 simultaneously and a positive erase voltage is applied to all the memory cells M11 to M34. At the time of erase and write operation, a plurality of memory cells in the erase block are erased collectively.

Inevitably, some of the memory cells have not been written in the previous erase and write operation. As all the memory cells are erased collectively, the erase bias is applied also to such memory cells. As a natural result, such memory cells strongly fall into the overerase condition. As described above with reference to FIGS. 1a to 5, the charge retention characteristics of such memory cells are degraded. Thus, there is a problem in that reliability of such semiconductor nonvolatile memory device is reduced considerably. It is not practical to configure the structure such that the memory cells are erased separately, because it increases the area of the semiconductor nonvolatile memory device and extends the erase time enormously.

In this connection, the drain-side hot-electron injection and the memory gate extraction are assumed in FIG. 1a. According to the principle shown in FIG. 5, any combination of the electron injection from the substrate and the memory gate extraction will cause a similar problem. The similar problem occurs even in the case of other electron injection methods such as the source-side hot-electron injection.

All the memory cells included in the erase unit at the time of erase and write operation are written once. Then, the erase bias is applied to perform the erase operation. The read current verifies each erase unit in order to inhibit the unwanted overerase condition.

BRIEF DESCRIPTION OF THE DRAWINGS

FIG. 1a is a diagram showing a memory cell structure for describing the principle of the present invention, and FIG. 1b is a diagram showing applied voltages in various operational modes of the memory cell structure.

FIG. 2 is a diagram showing erase characteristics of the memory cell in FIG. 1a.

FIG. 3 is a diagram showing charge retention characteristics of the memory cell in FIG. 1a.

FIG. 4 is a diagram showing erase and write operation characteristics of the memory cell in FIG. 1a.

DETAILED DESCRIPTION OF THE PREFERRED EMBODIMENTS

Embodiment 1

Figure 3:
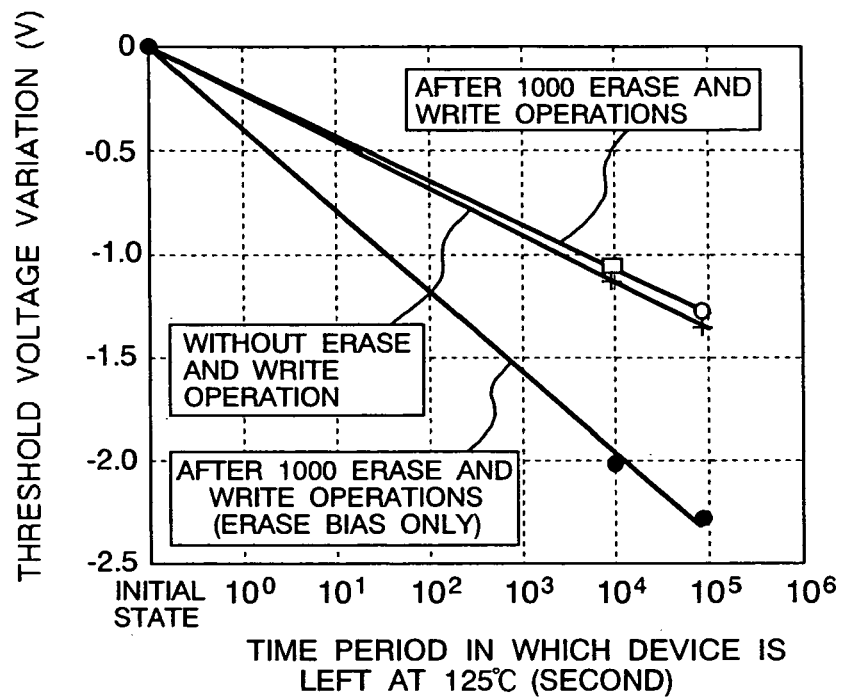
Figure 4:
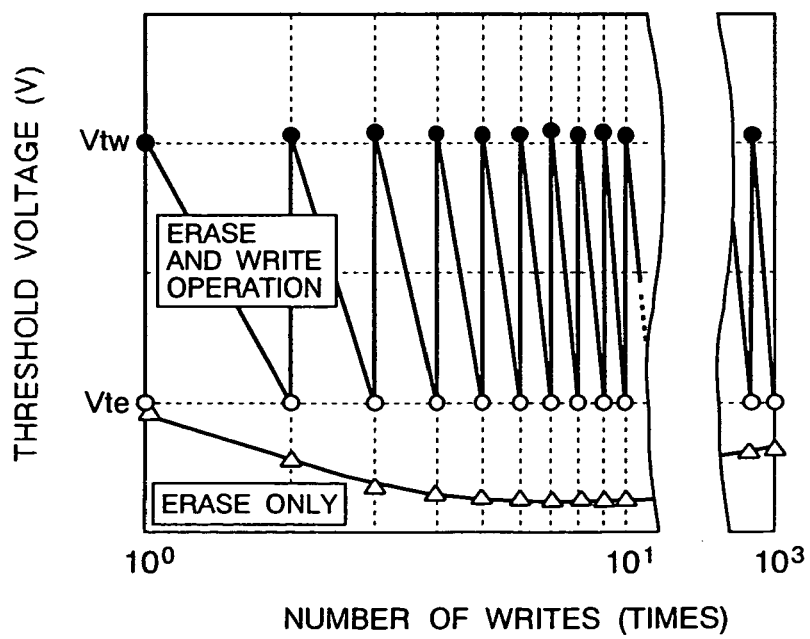
Figure 5:
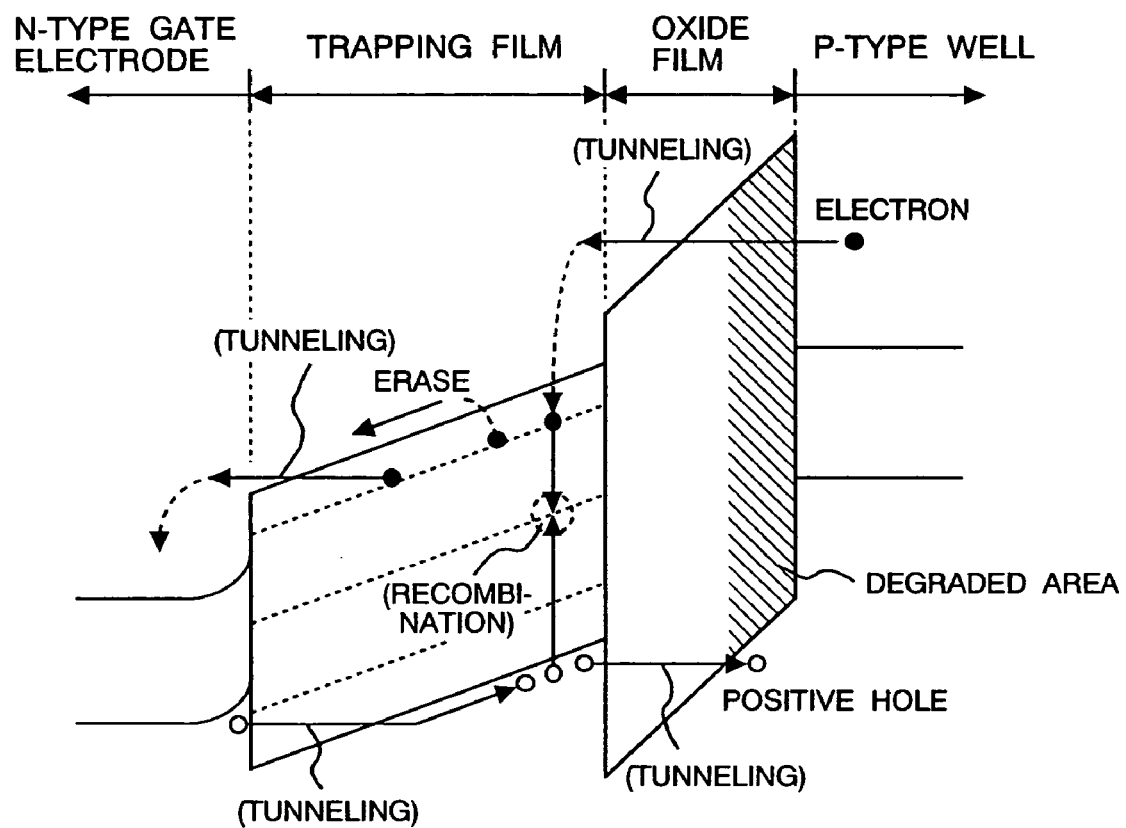
FIG. 5 is a diagram representing a cause of degradation of the charge retention characteristics of the memory cell.
Figure 6:
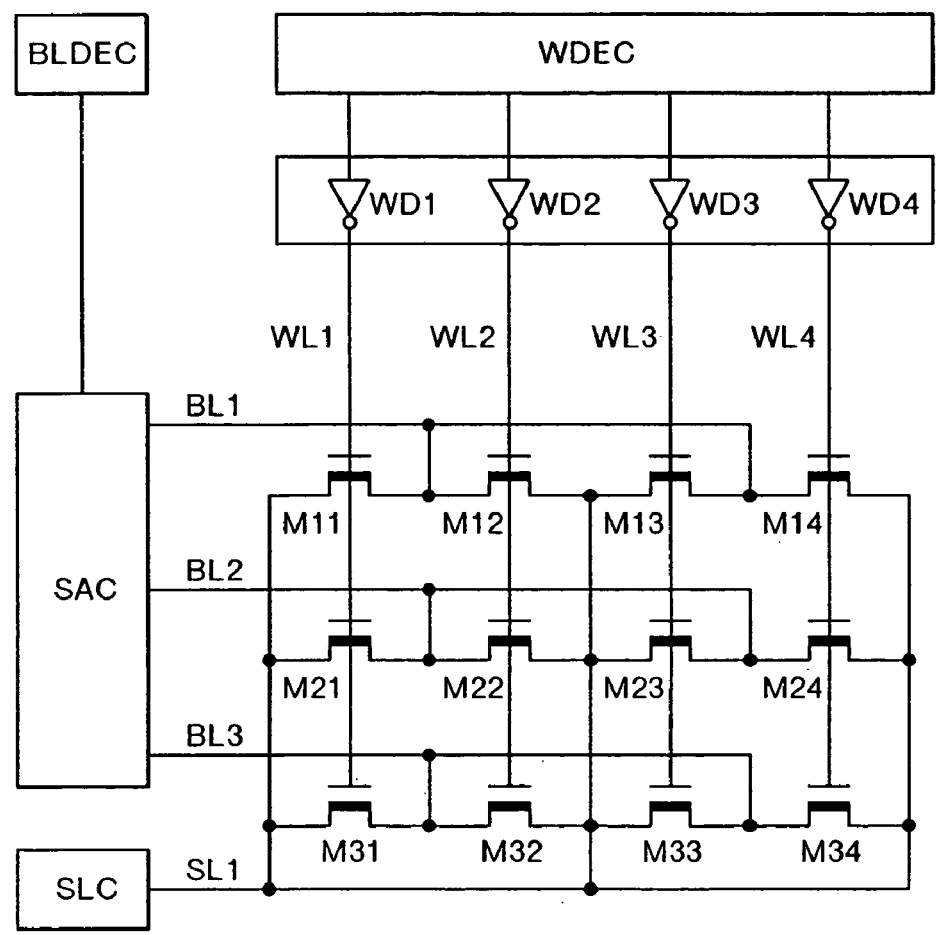
FIG. 6 is a semiconductor nonvolatile memory device to which the present invention is applied.
Figure 7:
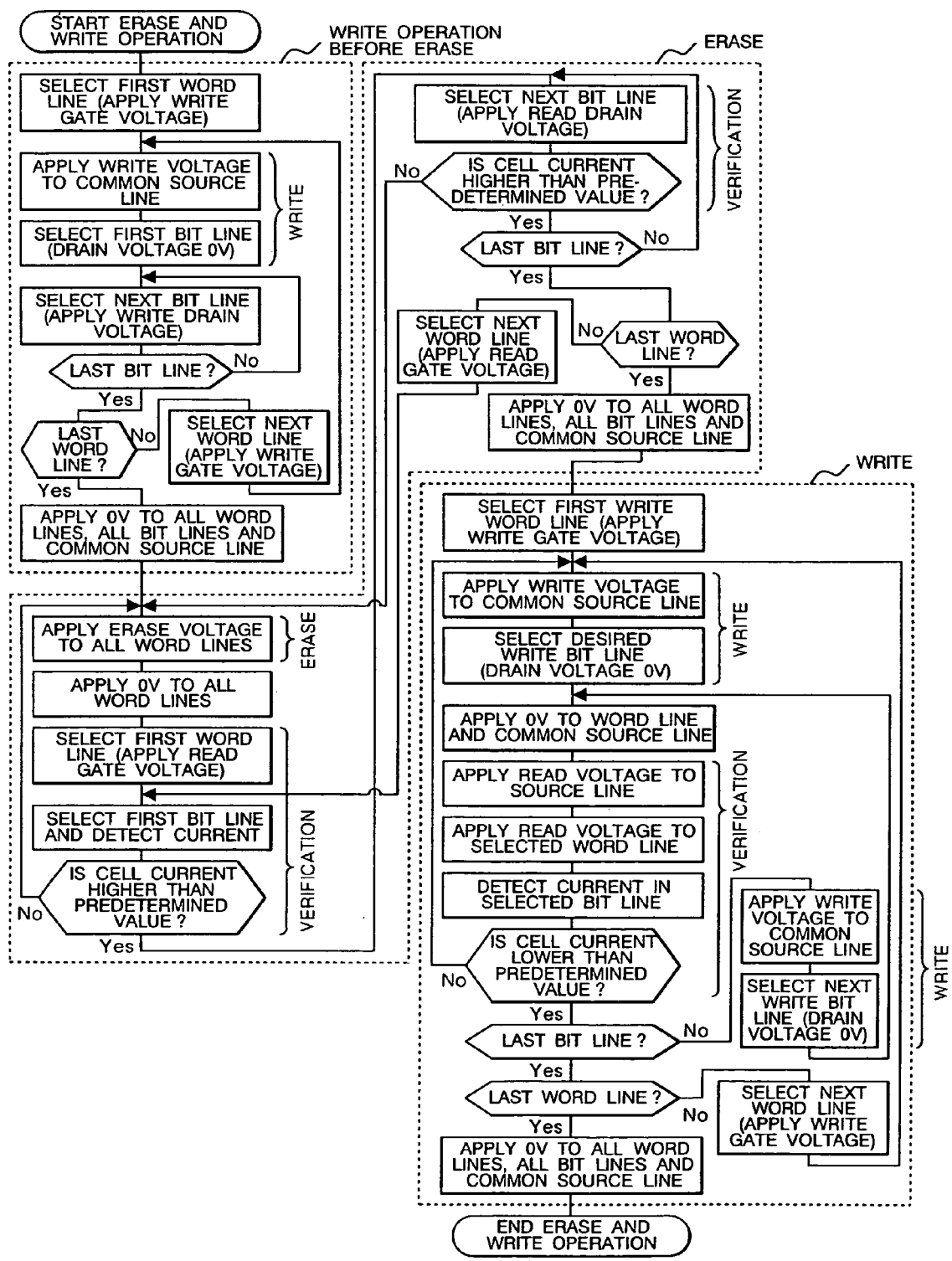
FIG. 7 is a flow chart showing a procedure for erase and write operation of the semiconductor nonvolatile memory device according to the present invention.

Assuming a semiconductor nonvolatile memory device in which all memory cells in an erase block are erased collectively as shown in FIG. 6, an erase and write operation procedure according to an embodiment of the present invention is shown in FIG. 7. After the erase and write operation starts, all the memory cells in the erase block are written. After the write process is completed, an erase bias is applied to all the memory cells in the erase block. The erase process terminates when it is ascertained that the threshold is reduced sufficiently to obtain a necessary read current in all the cells. According to the present invention, the process for writing all the memory cells in the erase block is integral to the application of the erase bias and is performed without exception when the erase command is executed. Then, in order to store necessary information, desired memory cells are written. The write operation is performed by hot-electron or tunnel injection. When the write is completed, all the erase and write operation is completed. This series of operations can prevent the memory cells from being in an overerase condition and improve the reliability of the semiconductor nonvolatile memory device. Hereinafter, the description will be provided in more detail with reference to FIGS. 6 and 7.

FIG. 6 is a circuit block diagram showing a NOR-type memory array that is comprised of memory cells described above with reference to FIG. 1. FIG. 6 shows a word line WL1 common to memory cells M11 to M31, a word line WL2 common to memory cells M12 to M32, a word line WL3 common to memory cells M13 to M33, and a word line WL4 common to memory cells M14 to M34. Word drivers WD1 to WD4 supply voltages to WL1 to WL4, respectively. A word decoder WDEC is a group of logic circuits that select any of WD1 to WD4 according to the address. Further, FIG. 6 shows a bit line BL1 common to the memory cells M11 to M14, a bit line BL2 common to the memory cells M21 to M24, and a bit line BL3 common to the memory cells M31 to M34. A group of sense amplifiers and their control circuit collectively designated as SAC supply a potential to BL1 to BL3 or detect a potential variation thereof. A decoder circuit BLDEC selects the sense amplifiers connected to BL1 to BL3 according to the address. A source line SL1 is common to all the memory cells M11 to M34. A control circuit SLC supplies a potential to SL1. An embodiment of the present invention will be described using this example. It is assumed that the memory array consists of 12 memory cells in this example. This is intended for simply describing the operation of the memory array and the embodiment of the present invention, and the number of the memory cells is not limited to that shown here.

The state in which the threshold of the memory cell is increased by the write operation is defined as "1", and the state in which the memory cell is not written and the threshold remains low is defined as "0". It is assumed that any information has already been written in this memory array and each memory cell M11 to M34 is in either state "1" or "0". In order to erase and write the information stored in this memory array, first, all the 12 memory cells M11 to M34 are put into the write state. This write operation before erase may be performed by hot-electron injection, just as in the case of the write operation for storing information. The write operation starts from the memory cell group connected to WL1 and proceeds to the subsequent memory cell groups in sequence and eventually to the memory cell group connected to WL4. WDEC selects WD1, and 10 V is applied to WL1. SLC supplies 0 V to SL1. Then, BLDEC sends an address signal to select BL1 to SAC. Receiving the signal, SAC supplies 5 V to only BL1 and 0 V to BL2 and BL3. At this time, hot-electron injection occurs in the memory cell M11, in relation to which both WL1 and BL1 are in the selected state, and M11 is written. Then, BLDEC supplies a signal for selecting BL2 to SAC so that SAC supplies 5 V to BL2 and 0 V to BL1 and BL3. At this time, M21 is written. Similarly, if BL3 is selected, M31 is written. After all the memory cells connected to WL1 are written, WL2 is selected and, again, the write voltage of 5 V is supplied to BL1 to BL3 in sequence. All the memory cells connected to all the word lines (here, WL1 to WL4) are written by repeating this procedure. The write operation for storing "1" as information requires a process for determining whether a predetermined threshold is reached. In contrast, the write operation before erase according to the present invention, which is not intended for storing information, does not particularly need to determine whether the write is completed. Therefore, it has an advantage in that the time required for the process can be reduced accordingly. In particular, in case of the hot-electron write, in which the variation in the write speed between memory cells is small, the process for determining the write may be omitted. Further, though the write operation before erase may be performed only for the memory cells in the "0" state, the need for the determination process can be eliminated by applying the write voltage to all the memory cells. Thus, the write operation before erase can reduce the total processing time. Still further, though the memory cells are written one by one in this example, a plurality of bit lines may be selected simultaneously so as to simultaneously write a plurality of memory cells.

After the write operation before erase is performed for all the memory cells as described above, an erase operation is performed to reduce the threshold. Here, a method for applying an erase voltage to all the word lines collectively will be described. BLDEC sends a signal for not selecting the bit lines to SAC. Receiving the signal, SAC sets BL1 to BL3 to 0 V. SLC sets SL1 to 0 V. WDEC selects all of WD1 to WD4. WD1 to WD4 apply an erase voltage of 10 V to WL1 to WL4, respectively. At this time, the erase voltage is applied to the gate electrodes of M11 to M34 and the thresholds of these memory cells are reduced. After the erase voltage is applied for a predetermined time period, M11 to M34 are read in sequence. The read M11 to M34 is for verifying whether each memory cell is erased, or whether the threshold of each memory cell is reduced so that each memory cell enters into the state in which a predetermined read current flows. First, SLC applies 1 V to SL1, and WD1 applies 1 V to WL1. Then, SAC sets BL1 to 0 V to detect the magnitude of the signal flowing into SAC through M11. If it is found that the desired read current flows, it is determined that M11 has been erased completely. Hereinafter, in a similar manner, BL2 is selected to read M21, and BL3 is selected to read M31. If any memory cell among M11 to M31 has not reached the erase state, the erase operation to apply 10 V to WL1 to WL4 is performed and the currents of the memory cells are verified again. After the erase of M11 to M31 is determined, the similar procedure is repeated. Then, if it is determined that all of M11 to M34 have reached the erase state, the erase operation of the memory array of FIG. 6 is completed.

After the erase operation is completed, according to the erase and write operation information, only the memory cells in which it is desired to store "1" are written. By way of example, a case in which, among the memory cells connected to WL1, only M11 is written as "1" and M21 and M31 are written as "0" will be described. WDEC selects WD1 to apply 10 V to WL1. SLC supplies 0 V to SL1. Then, BLDEC sends an address signal for selecting BL1 to SAC. Receiving the signal, SAC supplies 5 V to only BL1 and 0 V to BL2 and BL3. At this time, hot-electron injection occurs in the memory cell M11, in relation to which both WL1 and BL1 are in the selected state, and M11 is written. As M21 and M31 are in the erase state that corresponds to "0", they may be left as they are without write. In order to verify whether M11 has reached the necessary threshold, M11 is read after applying the write voltage. First, SLC applies 1 V to SL1, and WD1 applies 1 V to WL1. Then, SAC sets BL1 to 0 V to detect the magnitude of the signal flowing into SAC through M11. If the read current is lower than a predetermined value, it can be determined that the threshold of M11 has reached a predetermined value and the write operation is completed. If the current is higher than the predetermined value, the write is insufficient. Therefore, the write voltage is applied and the verification is performed again. Further, when "1" is stored in any of other memory cells M12 to M34, the write operation is performed and then it is verified whether the write is completed in a manner similar to that of M11. Thus, the erase and write operation method for the charge retention characteristics of the nonvolatile memory cells according to the present invention has been described above.

The method described above is shown in a flow chart of FIG. 7.

First, the write operation is performed for all the bits to be rewritten. A first word line is selected from a group of the word lines to be erased and written and a gate word voltage is applied. Next, a write voltage is applied to the common source line. Then, 0 V of a write selection signal is applied to the bit line connected to the cell to be written first and the cell is written. The write selection signal on the bit line is a pulse voltage applied to the drain of the cell. After this write operation, the next bit line is selected and a pulse of 0 V is applied to write the cell connected to the bit line. In the same way, the selection signal is applied to all the bit lines connected to the identical word line and all the cells connected to the word line are written. Subsequently, the next word line is selected, and the write voltage is applied from the first bit line in sequence again. Then, after the write operation is completed for all the word lines, the potential of all the word lines, all the bit lines, and the common source line is reduced to 0 V once. After that, the operation to reduce the thresholds of the cells is performed.

First, an erase voltage pulse is applied to all the word lines. Then, the potential of all the word lines is reduced to 0 V. Then, the operation to verify whether the thresholds are reduced sufficiently is started. First, a read gate voltage is applied to a first word line. Further, a read voltage is applied to a first bit line to select it and read the current of the cell residing at their intersection point. If this current is higher than a predetermined value, it can be considered that the threshold is reduced sufficiently. If the current value is lower than the predetermined value, the process returns to the operation to apply the erase voltage to all the word lines. Then, the current of the selected cell on the first word line and the first bit line is read again. If the current is higher than the predetermined value, the-process proceeds to the next bit line to verify whether the next cell current is higher than the predetermined value. If the current is lower than the predetermined value at this stage, the process must return to the operation to apply the erase voltage to all the word lines. If the current is higher than the predetermined value, the process further proceeds to the subsequent bit lines to perform similar verification continuously. All the bit lines on the identical word line are selected to detect the cell currents in sequence. If all these cell currents are higher than the predetermined value, the process proceeds to the next word line. After that, the similar procedure is repeated. If it can be determined that all the cell currents are higher than the predetermined value, the potential of all the word lines, all the bit lines, and the common source line is reduced to 0 V and the operation to reduce the thresholds terminates. The erase operation is performed by applying the erase voltage to all the word lines collectively in this example. The word lines may be divided into several groups and each of the groups may be treated as an erase unit in which the erase operation is performed collectively.

After the erase operation is completed, then, necessary information is written. The first word line is selected, a write voltage is applied to the common source line and, then, the write bit lines are selected. The selection of the write bit lines corresponds to the application of 0 V to the drain of the cell, which allows a channel current required for write to flow between the source and the drain of the cell. Next, the word line and the common source line are set to 0 V to turn off the channel current. Then, it is verified whether the information has been written correctly in this cell. A read current lower than that in the write operation is applied to the common source line. A read voltage is applied to the word line selected in the write operation. Then, 0 V is applied to the bit line connected to the cell to select it and detect the cell current. If the detected cell current is higher than a predetermined value, the threshold is not sufficiently high. Therefore, the write operation is performed again. If the current is lower than the predetermined value, it can be determined that the threshold is increased sufficiently or the cell is written normally. Therefore, the bit line connected to the cell to be written next is selected and the next cell is written. This procedure is repeated. After the write operation on the identical word line is completed, the next word line is selected and the bit lines to be written are selected to perform the write operation in sequence. After the write operation for the cells to be written on all the word lines is completed, the potential of all the word lines, all the bit lines, and the common source line is returned to 0 V and the erase and write operation terminates.

The operation to write all the memory cells before erase in the erase and write operation method according to the present invention is integral to the application of the erase bias. The process is performed without exception when the erase command is executed. This series of operations can prevent the memory cells from being in the overerase condition and improve the reliability of the semiconductor nonvolatile memory device. It is to be noted that the flow disclosed here is merely an example and other procedures may be used without departing from the scope of the present invention that the erase voltage is applied after all the bits that are subject to erase and write operation have been written once. For example, the verification process, which is to be performed upon the write of information after the erase is completed, may not be performed every time the cell is written, but it may be performed for every word line. More specifically, it may be performed collectively after the application of the write voltage to the cells to be written on one word line is completed.

Embodiment 2

Figure 8:
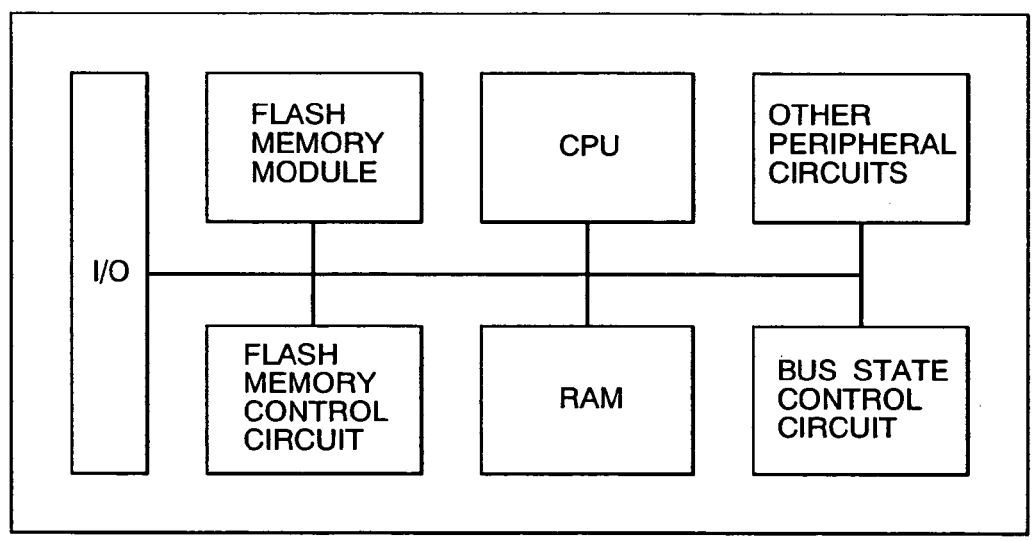
FIG. 8 is a microcontroller equipped with the semiconductor nonvolatile memory device according to the present invention.

FIG. 8 shows a microcontroller that is an embodiment of a semiconductor logic integrated circuit equipped with a memory array as shown in FIG. 6 on an identical substrate. This microcontroller is comprised of: a central processing unit CPU; a flash memory module; a flash memory module control circuit for controlling the flash memory module; a volatile memory module RAM; a bus state control circuit; an input/output circuit I/O; and other peripheral circuits having other functions. The flash memory module includes a nonvolatile memory array and has a nonvolatile information storage function. These circuit blocks are connected to an internal bus. This internal bus has signal lines for transferring an address signal, a data signal, and a control signal. The CPU performs instruction decode and processing according to the instruction. The flash memory module is utilized to store operating programs of the CPU and data. The flash memory module operates according to control data set in the flash memory module control circuit by the CPU. The RAM is utilized to temporarily store a work area of the CPU or data. The bus state control circuit controls accesses via the internal bus, an access cycles to external buses, a bus width, and so on. By using the erase and write operation method according to the present invention when the information in the flash memory module is erased and written, the degradation of the charge retention characteristics can be inhibited. Thus, a microcontroller equipped with a reliable nonvolatile memory can be provided.

By using a semiconductor integrated circuit device that utilizes a technique of the present invention, a reliable semiconductor nonvolatile memory device can be implemented. This device can be provided as a single chip. Further, the semiconductor integrated circuit device that uses the technique of the present invention may be mounted on the same substrate as a semiconductor logic device. In that case, the device can be used for storing data and programs and can be provided as a reliable built-in microcomputer or a card microcomputer. Still further, a high-functionality microcomputer having semiconductor nonvolatile memory devices for exclusively storing programs and data, respectively, can be provided.

Incidentally, reference numerals used in the figures in this application designate following elements: 1, N-type gate electrode; 2, Charge storage layer; 3, Underlying oxide film; 4, N-type drain electrode; 5, N-type source electrode; 6, P-type well; Vmg, Memory gate electrode applied voltage; Vs, Source electrode applied voltage; Vd, Drain electrode applied voltage; Vwell, Well electrode applied voltage; Vtw, Write determination threshold voltage; Vte, Erase determination threshold voltage; Vti, Charge neutral threshold; Vtoe, Saturated threshold voltage in overerase condition; Iread, Memory cell read current for erase determination; M11 to M34, Memory cells constituting nonvolatile memory device; WL1 to WL4, Word lines constituting nonvolatile memory device; SL1, Common source line constituting nonvolatile memory device; BL1 to BL3, Bit lines constituting nonvolatile memory device; WDEC, Decoder for selecting WL1 to WL4; BLDEC, Control circuit; SAC, Sense amplifier group and its control circuit for supplying potential to BL1 to BL3 or detecting potential variation; and SLC, Control circuit for supplying potential to SL1.

What is claimed is:
1. A semiconductor device comprising:
memory cells each of which comprises: a source diffusion layer and a drain diffusion layer formed on a main surface of a semiconductor substrate with a predetermined distance therebetween; and a gate section that is formed by stacking a charge storage film and a gate electrode via an insulation film on an area of said semiconductor substrate sandwiched between said source diffusion layer and said drain diffusion layer; and
control circuitry coupled to said memory cells to control operations of said memory cells,
wherein said control circuitry is constructed and performs control such that in an erase operation, holes are supplied from said gate electrode to said charge storage film, and electrons stored in said charge storage film and holes supplied from the gate electrode combine and disappear, and such that before erase and write operation of memory cells, the memory cells subject to said erase and write operation are written, and then said memory cells are erased, and
wherein each said memory cell is erased by reducing a threshold thereof, and the erase of the memory cell is stopped in response to a detection indicating that the threshold reaches a predetermined level selected to be above a threshold reduction saturation level of the memory cell.

2. A semiconductor device comprising:
subblocks in each of which memory cells are disposed, each of the memory cells comprising: a source diffusion layer and a drain diffusion layer formed on a main surface of a semiconductor substrate with a predetermined distance therebetween; and a gate section that is formed by stacking a charge storage film and a gate electrode via an insulation film on an area of said semiconductor substrate sandwiched between said source diffusion layer and said drain diffusion layer; and
control circuitry coupled to said memory cells to control operations of said memory cells,
wherein said control circuitry is constructed and performs control such that before rewriting said memory cells, a write operation is performed by injecting electrons into all the memory cells subject to an erase and write operation in said subblocks, and then an erase operation is performed by supplying holes from said gate electrode to said charge storage film,
wherein electrons stored in said charge storage film and holes supplied from said gate electrode combine and disappear, and
wherein each said memory cell is erased by reducing a threshold thereof, and the erase of the memory cell is stopped in response to a detection indicating that the threshold reaches a predetermined level selected to be above a threshold reduction saturation level of the memory cell.

3. The semiconductor device according to claim 1, wherein each said memory cell is a charge trapping memory cell having a MONOS or MNOS structure including a nitride charge trapping layer, and wherein said control circuitry is constructed and performs control such that said charge trapping memory cell is written by injecting electrons from said semiconductor substrate through said insulation film into said charge trapping memory cell.

4. The semiconductor device according to claim 2, wherein each said memory cell is a charge trapping memory cell having a MONOS or MNOS structure including a nitride charge trapping layer, and wherein said control circuitry is constructed and performs control such that said charge trapping memory cell is written by injecting electrons from said semiconductor substrate through said insulation film into said charge trapping memory cell.

5. The semiconductor device according to claim 1, wherein said control circuitry is constructed and performs control such that each said memory cell is written by electron injection using hot electrons.

6. The semiconductor device according to claim 2, wherein said control circuitry is constructed and performs control such that each said memory cell is written by electron injection using hot electrons.

7. The semiconductor device according to claim 1, wherein, in the case of the erase of a memory cell, a read current of the memory cell is detected and the erase is stopped in response to a detection that the read current reaches a predetermined value corresponding to said predetermined threshold level.

8. The semiconductor device according to claim 2, wherein, in the case of the erase of a memory cell, a read current of the memory cell is detected and the erase is stopped in response to a detection that the read current reaches a predetermined value corresponding to said predetermined threshold level.

9. A semiconductor device comprising:
memory cells each of which comprises: a first impurity doped region and a second impurity doped region formed on a main surface of a semiconductor substrate with a predetermined distance therebetween; and gate section that is formed by stacking a charge storage film and an electrode via an insulation film on an area of said semiconductor substrate sandwiched between said first impurity doped region and said second impurity doped region; and
control circuitry coupled to said memory cells to control operations of said memory cells,
wherein said control circuitry is constructed and performs control such that in an erase operation, holes are supplied from said electrode to said charge storage film, and electrons stored in said charge storage film and holes supplied from the electrode combine and disappear, and such that an erase command of said memory cells is executed after writing memory cells subject to said erase, and
wherein each said memory cell is erased by reducing a threshold thereof, and the erase of the memory cell is stopped in response to a detection indicating that the threshold reaches a predetermined level selected to be above a threshold reduction saturation level of the memory cell.

10. A semiconductor device comprising:
subblocks in each of which memory cells are disposed, each of the memory cells comprising: a source diffusion layer and a drain diffusion layer formed on a main surface of a semiconductor substrate with a predetermined distance therebetween; and a gate section that is formed by stacking a charge storage film and a gate electrode via an insulation film on an area of said semiconductor substrate sandwiched between said source diffusion layer and said drain diffusion layer; and
control circuitry coupled to said memory cells to control operations of said memory cells, wherein said control circuitry is constructed and performs control such that before writing data to selected memory cells in a subblock, every memory cell of the subblock is subjected to a write operation and then an erase operation, regardless of whether the memory cell is selected for writing data, wherein the write operation is performed by injecting electrons into the charge storage film, the erase operation is performed by supplying holes from said gate electrode to said charge storage film, and electrons stored in said charge storage film and holes supplied from said gate electrode combine and disappear, and wherein each said memory cell is erased by reducing a threshold thereof, and the erase of the memory cell is stopped in response to a detection indicating that the threshold reaches a predetermined level selected to be above a threshold reduction saturation level of the memory cell.

11. The semiconductor device according to claim 10, wherein the predetermined level is selected to be above a charge neutral threshold of the memory cell.

12. A semiconductor device comprising:
memory cells each of which comprises: a first impurity doped region and a second impurity doped region formed on a main surface of a semiconductor substrate with a predetermined distance therebetween; and gate section that is formed by stacking a charge storage film and an electrode via an insulation film on an area of said semiconductor substrate sandwiched between said first impurity doped region and said second impurity doped region; and control circuitry coupled to said memory cells to control operations of said memory cells, wherein said control circuitry is constructed and performs control such that in an erase operation, holes are supplied from said electrode to said charge storage film, and electrons stored in said charge storage film and holes supplied from the electrode combine and disappear, and such that before data is written to selected memory cells of a predetermined group of memory cells, every memory cell of said group is subjected to a write operation and then an erase operation, regardless of whether the memory cell is selected for writing data, and wherein each said memory cell is erased by reducing a threshold thereof, and the erase of the memory cell is stopped in response to a detection indicating that the threshold reaches a predetermined level selected to be above a threshold reduction saturation level of the memory cell.

13. The semiconductor device according to claim 12, wherein the predetermined level is selected to be above a charge neutral threshold of the memory cell.

14. The semiconductor device according to claim 1, wherein the predetermined level is selected to be above a charge neutral threshold of the memory cell.

15. The semiconductor device according to claim 2, wherein the predetermined level is selected to be above a charge neutral threshold of the memory cell.

16. The semiconductor device according to claim 9, wherein the predetermined level is selected to be above a charge neutral threshold of the memory cell.

17. The semiconductor device according to claim 10, wherein, in the case of the erase of a memory cell, a read current of the memory cell is detected and the erase is stopped in response to a detection that the read current reaches a predetermined value corresponding to said predetermined threshold level.

18. The semiconductor device according to claim 12, wherein, in the case of the erase of a memory cell, a read current of the memory cell is detected and the erase is stopped in response to a detection that the read current reaches a predetermined value corresponding to said predetermined threshold level.

* * * * *